United States Patent [19]

Hickey et al.

[11] Patent Number: 4,707,124
[45] Date of Patent: Nov. 17, 1987

[54] APPARATUS FOR EXPOSING PHOTOSENSITIVE MEDIA

[75] Inventors: Duane B. Hickey; Robert V. Hickey, both of Corvallis, Oreg.

[73] Assignee: CH2M Hill, Inc., Corvallis, Oreg.

[21] Appl. No.: 772,172

[22] Filed: Sep. 3, 1985

[51] Int. Cl.$^4$ .............................................. G03B 27/80
[52] U.S. Cl. ...................................... 355/83; 355/132
[58] Field of Search .................. 355/35, 36, 38, 69, 355/83, 85, 115, 132, 68; 250/559; 356/443

[56] References Cited

U.S. PATENT DOCUMENTS

| | | | |
|---|---|---|---|
| 754,083 | 3/1904 | McIntire | 355/113 |
| 1,799,818 | 4/1931 | Hopkins | 355/113 |
| 2,226,157 | 12/1940 | Christie et al. | 355/113 |
| 2,774,289 | 12/1956 | Collins | 355/91 |
| 2,857,555 | 10/1958 | Koen et al. | 355/68 X |
| 3,513,308 | 5/1970 | Tajima et al. | 355/83 |
| 3,521,952 | 7/1970 | Nelson et al. | 355/38 |
| 3,640,620 | 2/1972 | Shatz et al. | 355/38 |
| 3,723,000 | 3/1973 | Sone | 355/83 |
| 3,761,176 | 9/1973 | Lewer | 355/83 |
| 3,860,341 | 1/1975 | Tobias | 355/115 |
| 3,936,186 | 2/1976 | Boland et al. | 355/83 |
| 3,995,955 | 12/1976 | Topfer | 355/91 |
| 4,029,404 | 6/1977 | Mizukami et al. | 355/76 X |
| 4,053,226 | 10/1977 | Michalski et al. | 355/83 X |
| 4,111,549 | 9/1978 | Cazel et al. | 355/83 X |
| 4,143,968 | 3/1979 | Sader et al. | 355/83 |
| 4,159,176 | 1/1979 | de Masi | 355/125 X |
| 4,161,363 | 7/1979 | Kahle | 355/83 X |
| 4,265,532 | 5/1981 | McIntosh | 355/83 X |
| 4,526,463 | 7/1985 | Hickey et al. | 355/83 |

FOREIGN PATENT DOCUMENTS

| | | | |
|---|---|---|---|
| 1522890 | 10/1969 | Fed. Rep. of Germany | 355/83 |
| 135851 | 10/1981 | Japan | 355/75 |

OTHER PUBLICATIONS

The Carlson LI-46 Integrator Operator's Manual.
A Brochure, "The Image You Want Is The Image You Get With The Carlson LI-46 Integrator.
A Brochure, "The GAM Platemaker Light Integrator".
A Flyer Entitled "GAM Light-Time Integrator".
A Brochure, "BTC Mini-Integrator".
A Brochure, "DLI-76 Digital Light Integrator".
Two Douthitt Corporation Catalogs.
Graphic Arts Equipment Catalog".
A Brochure, "Berkey Ascor Addalux".
A Brochure, "Thiemer Time Savers Copymat".
A Brochure, "BTC Ascor Instant.2 Addalux Vacuum Printer 24×28".
A Brochure, "Myloprint Processing Equipment".
A Brochure, "Thiemer Time Savers".
A "GAF" Company Flyer Relating To The GAF Serial 100 Flatbed Printer.
A Brochure, "Introducing Solar 420, A Totally New Exposure System".

Primary Examiner—L. T. Nix
Assistant Examiner—D. Rutledge
Attorney, Agent, or Firm—Klarquist, Sparkman, Campbell, Leigh & Whinston

[57] ABSTRACT

An apparatus for exposing photosensitive media is disclosed in which the light reaching or passing through photosensitive media is monitored, with the exposure being terminated after the desired amount of light has been received. Slope control circuitry is provided to selectively and non-linearly vary the exposure with variations in the density of originals which are being copied simultaneously. In a wide variety of applications the apparatus produces high quality prints, by automatically compensating for variations in exposure due to, for example, variations in the number of originals being copied.

17 Claims, 11 Drawing Figures ns in light required for exposure appear to arise from factors such as variations in density (transmissivity) of originals through which the photosensitive media is exposed; variation in the transmissivity of photosensitive media when light passing through the media is sensed; and variations in the response of the photosensitive material to light passing through originals of varying density. The density variations in originals can result from, for example, varying the number of originals through which the photosensitive media is exposed and variations in the density of individual original sheets.

APPARATUS FOR EXPOSING PHOTOSENSITIVE MEDIA

BACKGROUND OF THE INVENTION

This invention relates to an improved apparatus for exposing photosensitive media. More specifically, this invention relates to such an apparatus which is selectively operable to compensate for variations in light required to expose photosensitive media. Such variations in light required for exposure appear to arise from factors such as variations in density (transmissivity) of originals through which the photosensitive media is exposed; variation in the transmissivity of photosensitive media when light passing through the media is sensed; and variations in the response of the photosensitive material to light passing through originals of varying density. The density variations in originals can result from, for example, varying the number of originals through which the photosensitive media is exposed and variations in the density of individual original sheets.

Known print-making devices include a flat glass plate with a light source on one side and a lid or curtain on the other side. One or more original sheets or films to be copied are positioned on the glass plate above the light source and an overlying sheet of photosensitive material (i.e. diazo) is placed on top of the originals. The light source is turned on to expose a photosensitive layer of the photosensitive material.

In the print-making device disclosed in U.S. Pat. No. 4,526,463 of Hickey, et. al., a photosensor receives light passing through one or more original sheets to the photosensitive media. An integrator circuit integrates and thereby monitors the total light received by the photosensor over time. This circuit produces an integrator output voltage signal corresponding to the received light. A comparator circuit compares this integrator output signal with a reference voltage signal established by an operator of the print-making apparatus. When the desired amount of light has been received by the photosensor, the integrator output signal matches the reference voltage signal, and a correct exposure is deemed to have occurred. When this happens, the supply of light to the photosensitive media is shut off. The photosensitive media is then developed in a conventional manner. Because light passing through the original sheets to the sensitized media is monitored, this previously patented apparatus compensates somewhat for factors such as differences in density of the original sheet or sheets and variations in the intensity of light from the light source.

As another aspect of the U.S. Pat. No. 4,526,463 print-making apparatus, a "base tone" control operates to vary the relative capacitance which is coupled to the integrator circuit during first and second partial exposures. This facilitates multiple partial exposures of the same photosensitive media. With this technique, for example, portions of the resulting print will be faded relative to other portions of the print. Also, in such a print-making apparatus which was sold more than one year ago, in addition to the "base tone" control, a selection switch was provided for varying the magnitude of the capacitance included in the integrator circuit between two levels. By varying the capacitance, the range over which the device of U.S. Pat. No. 4,526,463 could be conveniently operated was enhanced.

Although the print-making device described in the prior Hickey et. al. patent greatly facilitates print-making and improves the quality of resulting prints in many circumstances, it does suffer from several drawbacks. In particular, when exposing photosensitive media through varying numbers or density of originals, in some cases the photosensitive media is incorrectly exposed to a substantial degree. Although this could be corrected to a certain extent by adjusting the reference voltage depending upon the number and density of originals, it is desirable to minimize the number of adjustments that need to be made as prints are produced. This incorrect exposure was more pronounced when the light sensor of the prior patented device was positioned to sense light passing through both originals and the photosensitive media in comparison to the case when light was sensed at the photosensitive layer.

Therefore, an improved apparatus for exposing photosensitive media is desirable to overcome these and other problems of prior art devices.

SUMMARY OF THE INVENTION

The reference voltage level established in the previously patented Hickey et. al. device determines the amount of light which exposes the photosensitive media during an exposure. One would naturally expect that the amount of light required for an exposure of a particular type of media would remain constant, regardless of the number or density of originals. Contrary to this expectation, it has been observed by the inventors that, for some photosensitive media, the amount of light required to expose the media to a desired level varies non-linearly with the number of original sheets through which the media is exposed. This variation in the amount of light required for satisfactory exposure is relatively insignificant when only a few original sheets are used. However, it becomes more noticeable as greater numbers of original sheets are employed. More specifically, as the number of sheets, and thus the density, of originals increase, the amount of light units that must be detected by the light sensor for proper exposure generally increases at a non-linear rate.

Although uncertain as to the cause of this effect, the inventors have speculated several possibilities. One possible explanation is that the layers of original sheets affect the spectrum of light reaching the photosensitive emulsion layer of the media being exposed. For example, the original sheets may block or filter increasing amounts of ultra-violet light to which certain emulsions are sensitized while a light sensor may be more sensitive to such frequencies of light. Thus, when the light sensor detects a particular amount of light, because of filtering, the light delivered to the media may be insufficient to satisfactorily expose the media. Also, in cases in which sensing is accomplished through the media itself, additional filtering of light reaching the light sensor also results from the media and may affect the reading by the light sensor. Therefore, with greater numbers or density of originals, more of the filtered light is required to expose the media to the desired degree.

Regardless of the cause, in accordance with the invention, the exposure is adjusted to more closely track the desired exposure whether few or many originals are employed. Moreover, the print-making apparatus of the present invention automatically compensates for this variation in exposure whether light is being sensed through the originals and the photosensitive media, or at the emulsion layer of the media.

In accordance with more specific aspects of the present invention, an improved apparatus for exposing photosensitive media includes one or more of the following features, either alone or in cooperation with one or more of the other features:

An apparatus for exposing photosensitive media having a light sensing means for receiving light from a light source during exposure of the photosensitive media. The light sensing means is positioned to receive light from the light source which passes through one or more original sheets. The light may or may not be passed through the photosensitive media prior to detection by the light sensing means. The apparatus also includes light monitoring means for monitoring the light received by the light sensing means and for automatically stopping the exposure of the photosensitive media upon the sensing of a predetermined amount of light. In addition, the light monitoring means includes means selectively operable to vary the predetermined amount of light non-linearly with variations in the transmissivity or density of materials through which the light passes to the light sensing means.

Such an apparatus in which the last mentioned means selectively increases the predetermined amount of light non-linearly with decreases in the transmissivity of originals through which light passes to the light sensing means. Such variations in transmissivity arising from factors such as variations in the number or density of originals through which light passes.

Such an apparatus in which the light monitoring means comprises an integrator circuit means. The integrator circuit being responsive to the amount of light sensed over time by the light sensing means for producing an output indicative that the predetermined amount of light has been received. The light sensing means comprising means for charging a capacitor means of the integrator circuit in response to the amount of light received by the light sensing means. The integrator circuit produces the output signal when the capacitor means is charged to a predetermined voltage. The integrator circuit further including a slope control means for partially discharging the capacitor means to thereby increase the amount of light that must be received by the light sensing means to charge the capacitor means to the predetermined voltage.

Such an apparatus in which the slope control means is adjustable to vary the rate at which the capacitor means is partially discharged to thereby vary the amount of light that must be received by the light sensing means to charge the capacitor means to the predetermined voltage.

Such an apparatus which further includes a slope adjustment control for delivering additional current to the capacitor means to thereby increase the rate of charging of the capacitor means to the predetermined voltage. This adjusts the amount of light that must be received by the light sensing means in order to charge the capacitor means to the predetermined voltage.

Such an apparatus in which the slope control means comprises resistor means in parallel with the capacitor means.

Such an apparatus in which the slope control means includes means for selectively varying the resistance of the resistor means.

Such an apparatus in which the capacitor means comprises means for selectively varying the capacitance included in the integrator circuit.

The invention also comprises an improved method of exposing photosensitive media to a source of light. More specifically, a sandwich of one or more original sheets and a sheet of photosensitive media is exposed to a source of light. The light passing through the original sheets, which may or may not pass through the sheet of photosensitive media, is sensed and monitored by a light sensing means. Exposure of the media is stopped upon sensing a predetermined amount of light. In accordance with method, the predetermined amount of light is selectively varied non-linearly with changes in the density or transmissivity of materials through which light passes to the photosensitive media. In such a method, the predetermined amount of light is increased with increasing densities of such materials, for example due to increasing numbers of original sheets.

It is an object of the present invention to provide an improved apparatus and method for exposing photosensitive media.

A further object of the present invention is to provide a print-making apparatus and method which automatically compensates for variations in exposure required for producing prints of high quality when the number of originals being copied varies or the light transmissivity of the combined originals is changed.

It is another object of the present invention to provide a print-making apparatus and method which more accurately exposes a wide variety photosensitive media to provide prints of enhanced quality, regardless of the changes in light transmissivity of the combined originals.

Still another object of the present invention is to provide such an apparatus and method which is versatile and which is relatively simple and convenient to use.

These and other objects, features and advantages of the present invention will become more apparent with reference to the following description and drawings.

INCORPORATION BY REFERENCE

U.S. Pat. No. 4,526,463 of Hickey et. al, entitled "Apparatus for Exposing Photosensitive Media", issued on July 2, 1985, is hereby fully incorporated by reference herein.

DETAILED DESCRIPTION OF PREFERRED EMBODIMENT

As previously mentioned, it has been discovered that the amount of light required to expose photosensitive media increases non-linearly with increases in the density of materials through which light is passed to the photosensitive media. For example, due to increases in the number of original sheets through which the media is exposed. By accurately compensating for this effect, higher quality prints result. In addition, with such compensation, high quality prints can be obtained sensing at the emulsion layer of the photosensitive media or through the photosensitive media. However, if the density of the media (i.e. twenty-pound pulp paper) fluxuates substantially, it becomes preferrable to sense the light at the emulsion layer as mentioned in U.S. Pat. No. 4,526,463 of Hickey, et. al.

In the illustrated embodiment, as explained below, this compensation is accomplished by selectively altering the integrating characteristics of an integrator circuit to adjust the amount of light received by a light sensor prior to termination of an exposure of media.

More specifically, with reference to the figures, an apparatus for directing light through one or more originals or samples thereof to a sheet of photosensitized media is shown. The sensitized media can be any type of photosensitive material such as diazo, silver film or other print paper. The original contains information which is desired to be reproduced on the sensitized media. These originals can be paper, film, cloth or other material through which light can pass. In addition, the apparatus is suitable for dot screen reproductions, as well as solid line reproductions.

Figure 1:
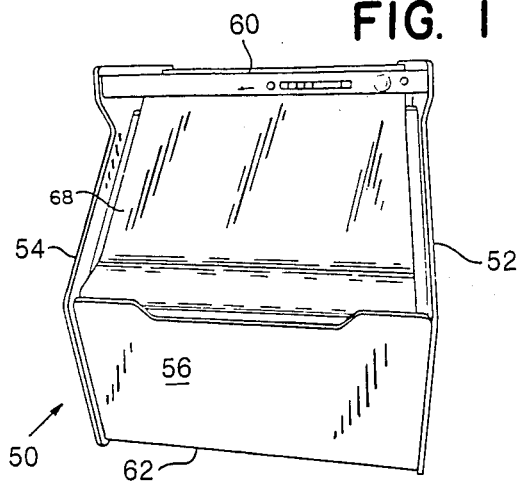
FIG. 1 is a front isometric view of one embodiment of an apparatus in accordance with the present invention.
Figure 2:
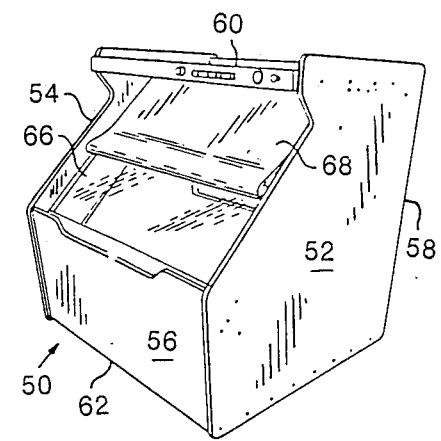
FIG. 2 is a side isometric view of the apparatus of FIG. 1.

With reference to FIGS. 1 and 2, the apparatus includes an enclosed housing 50 with sidewalls 52, 54, a front wall 56, and back wall 58. The housing also includes a bottom panel 62 and a top panel 60.

A plate 66 of a transparent material, such as glass, is supported by the housing 50. This plate can be positioned in a horizontal plane, a vertical plane, or at any angle therebetween. In the illustrated form, the plate is inclined as shown in FIGS. 1 and 2.

Hinged lids or other covers can be utilized to overlay the original prints and photosensitive film after they are positioned on the glass plate. However, in the illustrated embodiment, a rolling flexible curtain 68 is utilized. This curtain, as well as a suitable vacuum system for holding the originals and media in place, are explained in detail in U.S. Pat. No. 4,526,463.

Figure 3:
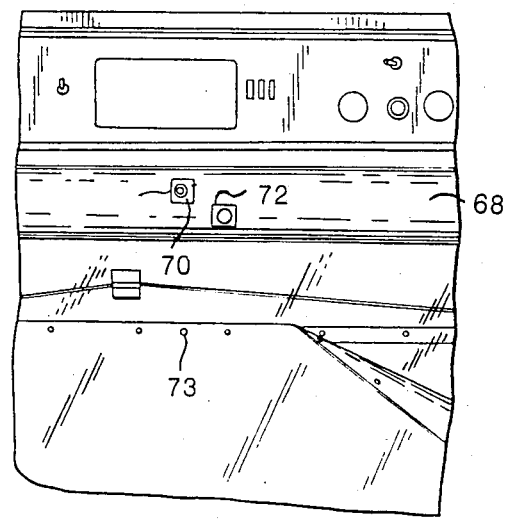
FIG. 3 is a partial front elevational view of the apparatus of FIG. 1 showing two light sensors mounted to a curtain of the apparatus.

In FIG. 3, the curtain 68 is shown in its rolled up position. A pair of photosensors, such as photodiodes 70, 72 are mounted to the curtain at a position so that they automatically overlay the original sheets to be copied and the photosensitive media when the curtain is lowered. Photodiode 70 may register with or be positioned over an off-centered aperature 73 provided through the sheet of sensitized media, but not through the original sheet or sheets. In this case, photodiode 70 directly monitors light which reaches the photosensitive or emulsion layer on the undersurface of the sensitized sheet. Alternately, if the media does not have such an aperature 73, photodiode 70 directly monitors light passing through the originals and the media. Photodiode 72 is positioned lower on the curtain than photodiode 70 for monitoring light when a "sandwich" of originals and media are placed in a lower position on the plate 66. A switch 130, described in connection with FIG. 6, selects which of the two photodiodes is used for sensing purposes. Both photodiodes 70 and 72 are positioned over data-free portions of the original sheets.

Figure 4:
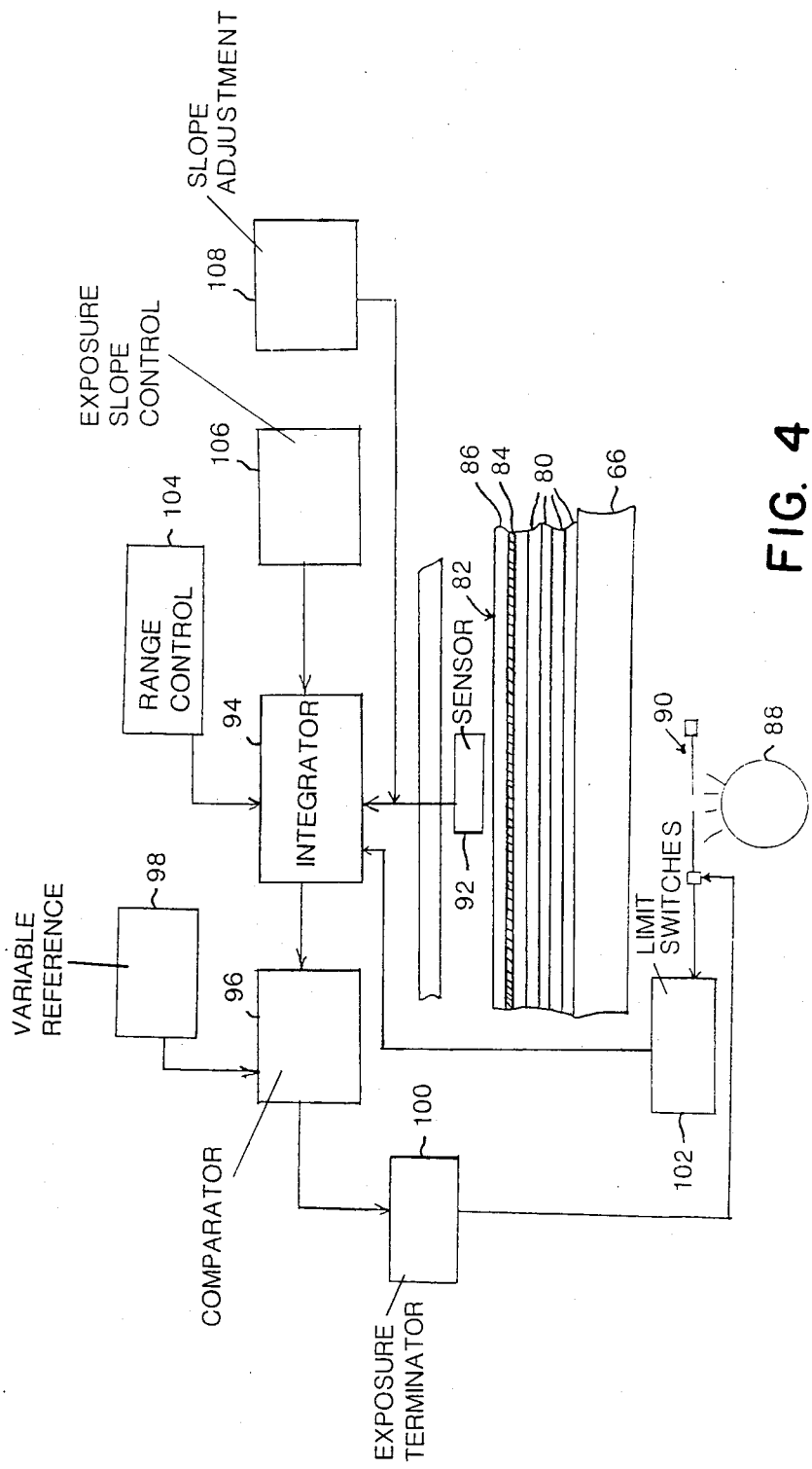
FIG. 4 is a block diagram showing the control functions and circuitry for the exposure adjustment and determination portions of the apparatus of FIG. 1.

Referring to FIG. 4, the overall system and circuitry for controlling the exposure of the photosensitive media will next be described. A plurality of original sheets 80 are positioned on top of glass plate 66. The photosensitive media sheet 82 overlies the originals 80 to form a "sandwich". The media 82 has an emulsion layer 84 positioned adjacent to the originals. The backing or substrate 86 of the photosensitive media is on top of the "sandwich". A light 88 serves to expose the emulsion layer of photosensitive media 82 through the original sheets 80. Any suitable light source may be used, such as a metal halide lamp. A relatively high speed shutter 90 is interposed between the light and the glass plate to control exposure of the media.

Figure 6:
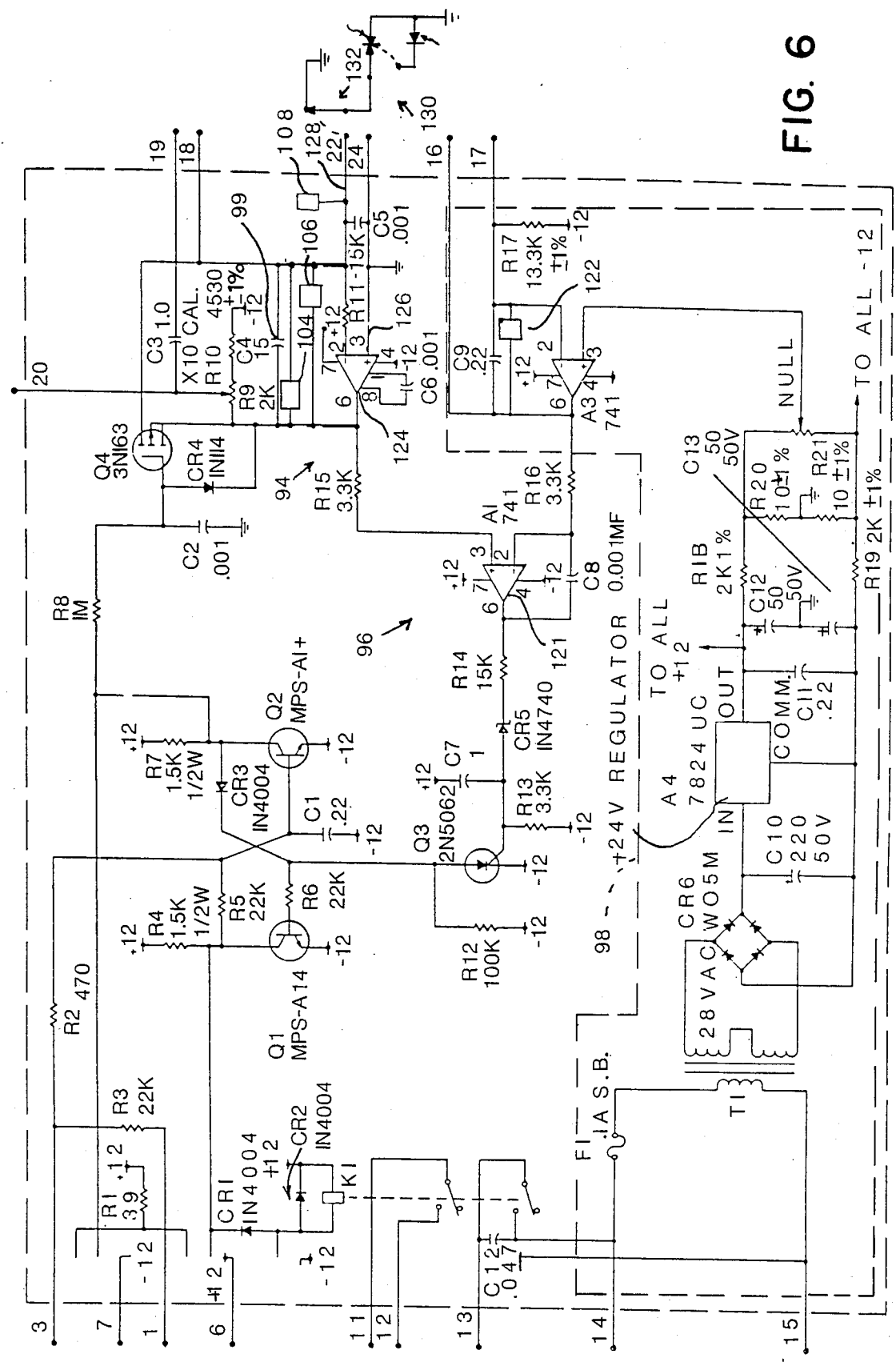
FIG. 6 is a schematic diagram of a suitable integrator circuit for the apparatus of FIG. 1.

A light sensor 92, which may comprise the photodiodes 70 or 72 (FIG. 3), detects the quantity of light passing through the originals and either through or not through the photosensitive media, depending upon whether an aperature 73 is provided. A current signal from sensor 92 (FIG. 4), corresponding to the intensity of light being received, is transmitted to integrator circuit 94. Integrator circuit 94 integrates this signal, and thus in effect monitors the quantity of light received by light sensor 92. Integration continues until the correct exposure is achieved, as established by other elements of the apparatus. One suitable integrator circuit is designated L-I-46 and is manufactured by Chesley-Carlson Company of 2230 Edgewood Avenue, Minneapolis, Minn. 55426. A schematic diagram of this integrator circuit 94, as modified in accordance with the present invention, is shown in FIG. 6.

A comparator 96 compares the signal from integrator circuit 94 with a reference signal established by a variable reference circuit 98. When the integrated signal provided by integrator circuit 94 matches the variable reference signal, the comparator signals an exposure terminator circuit 100. Circuit 100 may include a switch or relay for causing the shutter 90 to close in response to the comparator output signal. Limit switches 102 are coupled to shutter 90 and operate in a conventional manner to supply an electrical signal to integrator circuit 94 so as to indicate whether shutter 90 is opened or closed.

Three auxiliary circuits, a range control circuit 104, an exposure slope control circuit 106 and a slope adjustment circuit 108 operate to vary the exposure of photosensitive media 82.

In general, range control circuit 104 selectively varies the capacitance of integrator 94. This adjusts the rate at which the integrated signal reaches the reference level set by variable reference circuit 98. The addition of more capacitance by range control circuit 104, for example, increases the amount of light required at the light sensor 92 to charge the integrating circuit to the reference level. This in turn increases the exposure of the media. The converse is true as capacitance is decreased.

The exposure slope control circuit 106 generally operates to divert some of the current which charges the charging capacitor or capacitors of integrator circuit 94. Slope control circuit 106 may comprise a shunt resistor network connected across the charging capacitor or capacitors. The resistance of this network is selectively variable. In addition, by adjusting the resistance, the rate at which the integrator charges to the reference level varies to thereby alter the exposure of the photosensitive media.

In addition, slope adjustment control circuit 108 is an optional circuit which is designed to increase the charging rate of the capacitor or capacitors of integrator circuit 94. Slope adjustment circuit 108 may comprise a variable current source. This source, for example, compensates for the leakage current of tantalum electrolytic capacitors which may be used in range control circuit 104. In embodiments using less leakage prone capacitors in the range control circuit, such as polypropylene capacitors, slope adjustment circuit 108 is typically omitted.

Exposure slope control circuit 106 and slope adjustment circuit 108 non-linearly adjust the amount of light to which the photosensitive media is exposed as the number or density of original sheets varies. Therefore, these circuits improve the tracking of the actual exposure provided by the apparatus to the desired exposure for high quality prints.

Figure 5:
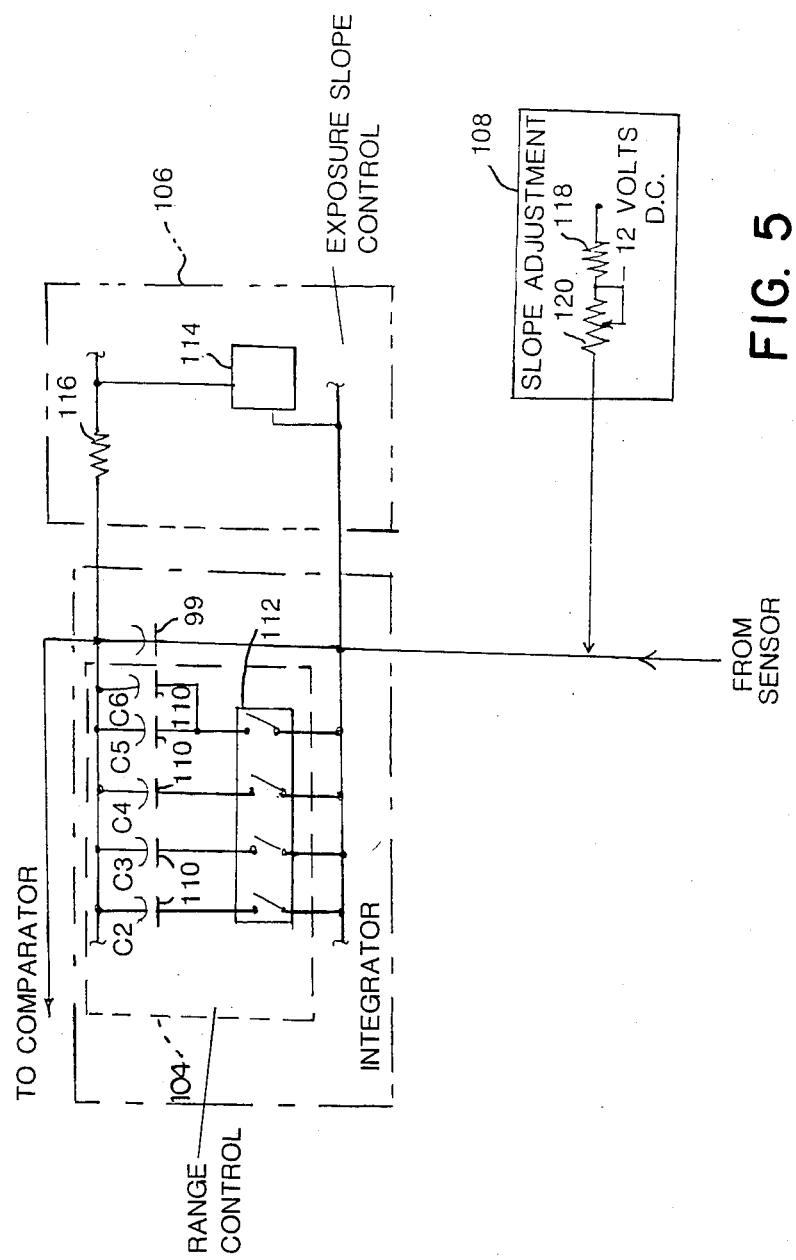
FIG. 5 is a schematic diagram of the range control, exposure slope control and slope adjustment portions of the block diagram of FIG. 4.

More specifically, with reference to FIG. 5, the illustrated range control circuit 104 contains a plurality of capacitors 110 which are selectively connected in parallel with an integrator circuit charging capacitor 99. Capacitors 110 are switched across capacitor 99 by a suitable switching mechanism, such as thumbwheel switch 112. One suitable switch is a ten position GEFE thumbwheel switch No. C-3.2LST.1 available from IVO Industries, Inc. of Eaton Town, N.J. The capacitor 92 and capacitors $C_2$–$C_6$ in FIG. 5 may be of any suitable magnitude. As a specific example, capacitor 99 can be 15 microfarads, capacitor $C_2$ can be 22 microfarads, $C_3$ can be 150 microfarads, $C_4$ can be 330 microfarads and $C_5$ and $C_6$ can total 660 microfarads. In addition, with the switch in position 0, none of the capacitors $C_2$–$C_6$ are coupled to the integrating circuit. With the switch in position 1, capacitor $C_2$ is coupled to the integrating circuit. With the switch in position 2, capacitor $C_3$ is coupled to the integrating circuit. In addition with the switch in the following positions, capacitors are coupled to the integrating circuit as follows: position 3—capacitors $C_2$ and $C_3$; position 4—capacitor $C_4$; position 5—capacitors $C_2$ and $C_4$; position 6—capacitors $C_3$ and $C_4$; position 7—capacitors $C_2$, $C_3$ and $C_4$; position 8—capacitors $C_5$ and $C_6$; and position 9—capacitors $C_2$, $C_5$ and $C_6$. Thus in progression, the integrator circuit includes from 15 microfarads to 697 microfarads of capacitance as the switch is shifted from position 0 to position 9.

Tantalum capacitors are used in the preferred embodiment because their leakage is comparatively high, thereby adding a non-linear element to the integrating function of the integrating circuit, which helps compensate for the above-referenced exposure problems. Tantalum capacitors are also less expensive and are smaller, for a given amount of capacitance, than many other types of capacitors. Although beneficial, the use of tantalum capacitors is not required as other capacitors may be used with satisfactory results.

Figure 7:
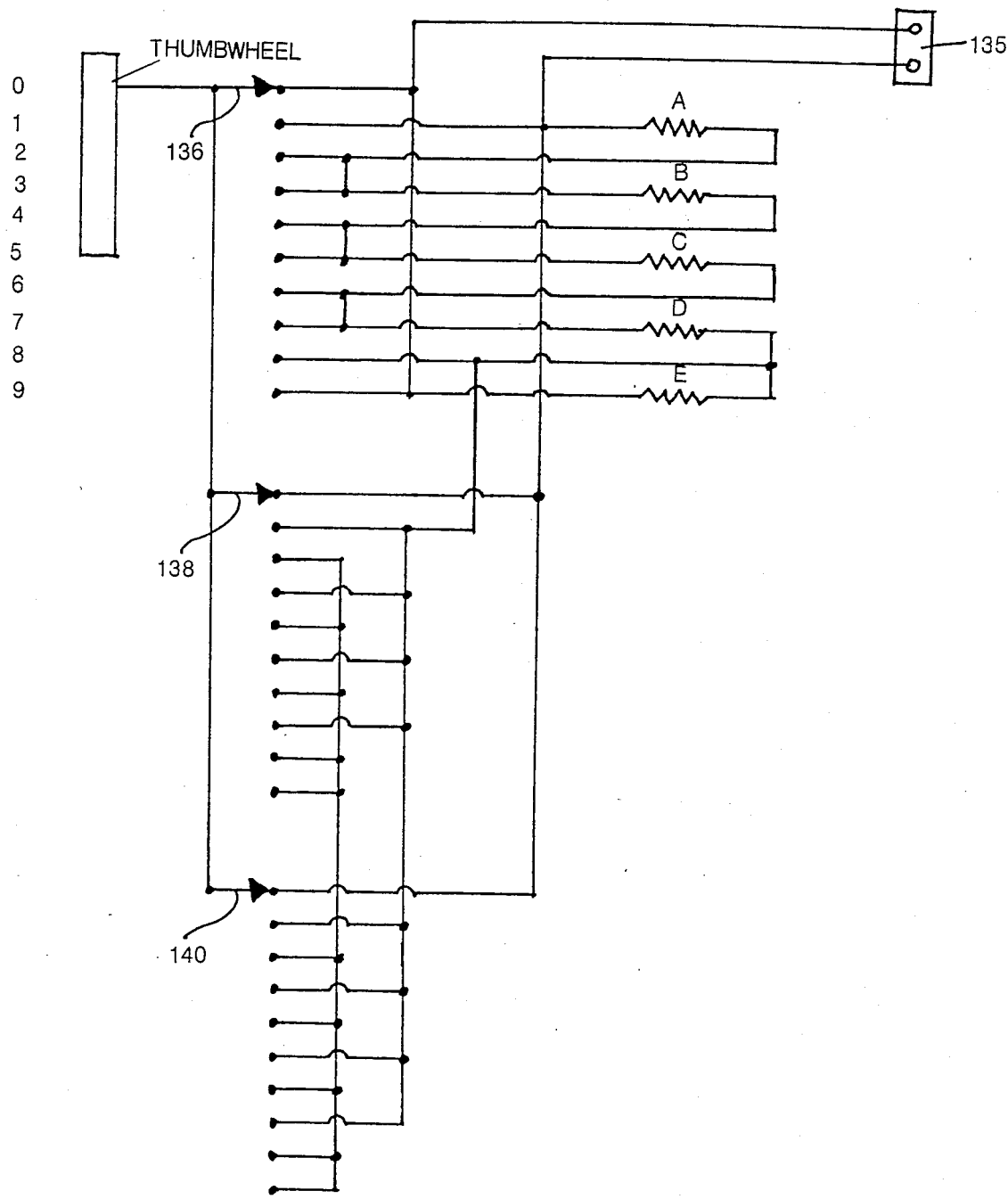
FIG. 7 is a schematic diagram of a thumbwheel controlled resistor network suitable for use in the exposure slope control and slope adjustment portions of the apparatus of FIG. 1.

The illustrated exposure slope control circuit 106 comprises a variable resistance shunt resistive element 114 in series with a 100 kilohm shunt resistor 116, which are connected across integrator charging capacitor 99. Element 114 can comprise, for example, a potentiometer or a network of resistors connected to thumbwheel switches, as shown in FIG. 7. The resistor 116 prevents integrator charging capacitor 99 from being short circuited.

With resistor network 114 in its maximum resistance configuration, virtually no current is shunted across capacitors 99 and 110. In this configuration, the exposure slope control circuit has little or no effect on the exposure. Thus, in applications in which the number of originals do not impact the exposure, the slope control circuit is adjusted to this configuration and proper exposure is still achieved. As the resistance of resistive network 114 is decreased, however, some of the current charging capacitor 99, and any capacitor 110 in the circuit, is trickled away from these capacitors. This increases the time needed for the capacitors to charge to the reference level. In addition, this correspondingly increases the exposure of the media so as to compensate for the above-referenced non-linearities.

With relatively high leakage tantalum capacitors 99, 110, current leakage across these capacitors tends to decrease the rate at which these capacitors charge to the reference level and thereby increase the exposure of the prints. Current shunting or leakage across the exposure slope control circuit also works to increase the print exposure. In some cases, the combination of these leakage mechanisms may sometimes provide greater integrating capacitor discharge than is desired. This can result in over exposed prints.

Slope adjustment circuit 108 may be used to increase, somewhat, the rate of charging of integrator charging capacitor 99 and any capacitors 110 coupled to the circuit. The slope adjustment circuit 108 thus counteracts to some degree the effect of the above leakages. To accomplish this, slope adjustment circuit 108 injects a controlled current directly into the integrating capacitors 99, 110. This current input parallels the input from the light sensing photodiode 70 or 72 (FIG. 3). To provide this current, a 3.3 megohm fixed resistor 118 is placed in series with a 2.0 megohm potentiometer 120. This series combination is positioned between the minus end of the integrating capacitors and a minus 12 volt direct current power supply. Potentiometer 120 is typically set at 1 megohm, for a total of 4.3 megohms of resistance in this series combination. In testing, such a current source has proved highly satisfactory. After the current level is initially set it is typically not adjusted further.

With reference to FIG. 6, the integrator circuit and other elements of the apparatus are shown in greater detail. As shown in this figure, variable reference circuit 98 is coupled to one input of a differential amplifier comparator 121 of comparator circuit 96. Included in the reference circuit 98 is a variable resistor 122 which is adjustable to set the magnitude of a reference voltage signal delivered to comparator 121. The variable resistor 122 may, for example, comprise a potentiometer or various resistors combined as determined by the position of thumbwheel switches as explained below.

The variable reference circuit 98 provides a broad range of available selectable reference voltages for the comparator circuit. This range of reference voltages in conjunction with range control 104 facilitates the use of the apparatus with a broad variety of original and photosensitive stocks, from transparent to relatively dense.

Integrator circuit 94 includes an amplifier 124 having one input 126 tied to ground. The other input 128 of amplifier 124 is coupled to one of the two photodiodes 70, 72 by a selector switch 130. A second switch 132 operates to ground the photodiodes when not being used, so as to prevent transmission of stray noise from the photodiodes to the integrator circuit.

Slope adjustment circuit 108 is depicted in block form in FIG. 6 and is connected to input 128 of amplifier circuit 124. Similarly, exposure slope control circuit 106 and range control circuit 104 are shown in block form shunted across the input 128 and the output of amplifier circuit 124. The fixed integration capacitor 99 is also shown in this figure in parallel with elements 104 and 106.

The remainder of the FIG. 6 schematic diagram will not be described in detail, as the operation of this circuit is readily apparent to those skilled in the art.

The thumbwheel resistor networks used in the variable resistor 122 of variable reference level circuit 98 and in the exposure slope control circuit 106 are shown in part in FIG. 7. The illustrated thumbwheel switches may comprise GEFE ten position thumbwheel switches No. 3.32 LST.1 available from IVO Industries, Inc. In FIG. 7, one such switch is shown in the "0" position. The resistance across the two terminals of the circuit connector 135 is thus zero ohms. When the thumbwheel is advanced to the "1" position, contacts 136, 138 and 140 move down to the next position in this figure. In this position, the resistor labeled E and having a unit value is switched into the circuit, providing a unit of resistance across the circuit connector terminals. Similarly, if contacts 136, 138 and 140 are moved to the second position, the resistor labeled D, having a value of two units of resistance will be switched into the circuit. Resistors A, B and C likewise have a resistance of two units. In succeeding thumbwheel positions, combinations of the four 2-unit resistances A, B, C and D and the single 1-unit resistance E are switched into the circuit to provide resistance in stepped increments from 0 to 9 units.

Thumbwheel switch mechanisms used in both the exposure slope control circuit and the variable reference level circuit 98 have ninety-nine selectable positions. These mechanisms each comprise two of the FIG. 7 thumbwheel switch networks connected in series, one network switching unit values of resistance and the second network switching decade values of resistance. In the variable reference circuit, a unit value of resistance is equal to 100 ohms. Thus, the variable resistance of this circuit is adjustable in 100 ohm increments from zero ohms to 9.9 kilohms. In the exposure slope control circuit, a unit of resistance is equal to 10,000 ohms. Therefore, the variable resistance of this circuit is adjustable in 10 kilohm increments from zero to 990 kilohms.

OPERATION OF THE APPARATUS

Operation of the print-making apparatus of the present invention proceeds with the following steps:

(a) Position a single original 80 and a sheet of photosensitive material 82 on the transparent glass surface 66.

(b) Set the slope control circuit at the maximum resistance to minimize the current bleed from the integrator circuit by the slope control circuit.

(c) Set the variable reference circuit 98 at a typical average level (i.e. setting 35) which provides approximately a two volt reference voltage signal. Typical reference voltages are from 2 to 4 volts with the variable reference level circuit providing reference voltages from 0 to 9 volts in steps of 0.1 volts.

(d) Adjust the range control circuit to the zero position so that the only capacitor in the integrator circuit is the fixed charging or integrating capacitor 99. This ensures that the integrator will charge rapidly and provide a quick exposure.

(e) Run a print and observe whether the quality is satisfactory.

(f) Successively adjust the range control to insert additional capacitors in the integrating circuit, and make a print at each setting. This is repeated until the desired print quality is visually observed.

(g) Adjust the variable reference level voltage provided by variable reference level circuit 98 to fine tune the apparatus for the desired quality of print.

(h) Position the maximum number of layers of originals to be used in making the prints (i.e. 5, 10 or more) beneath the photosensitive media.

(i) Adjust the exposure slope control 106 to various settings and run a print at each setting, until prints of the desired quality are produced. Having set the apparatus to operate properly with a single original and also with a plurality of originals, the apparatus will produce high quality prints using any number of originals to the maximum.

(j) Record the control settings and the type of originals, photosensitive media and emulsion used. In the future, these same settings are used for the same situation, except that slight adjustments may be needed to compensate for different manufactured lots of photosensitive media.

EXAMPLES

Figure 8:
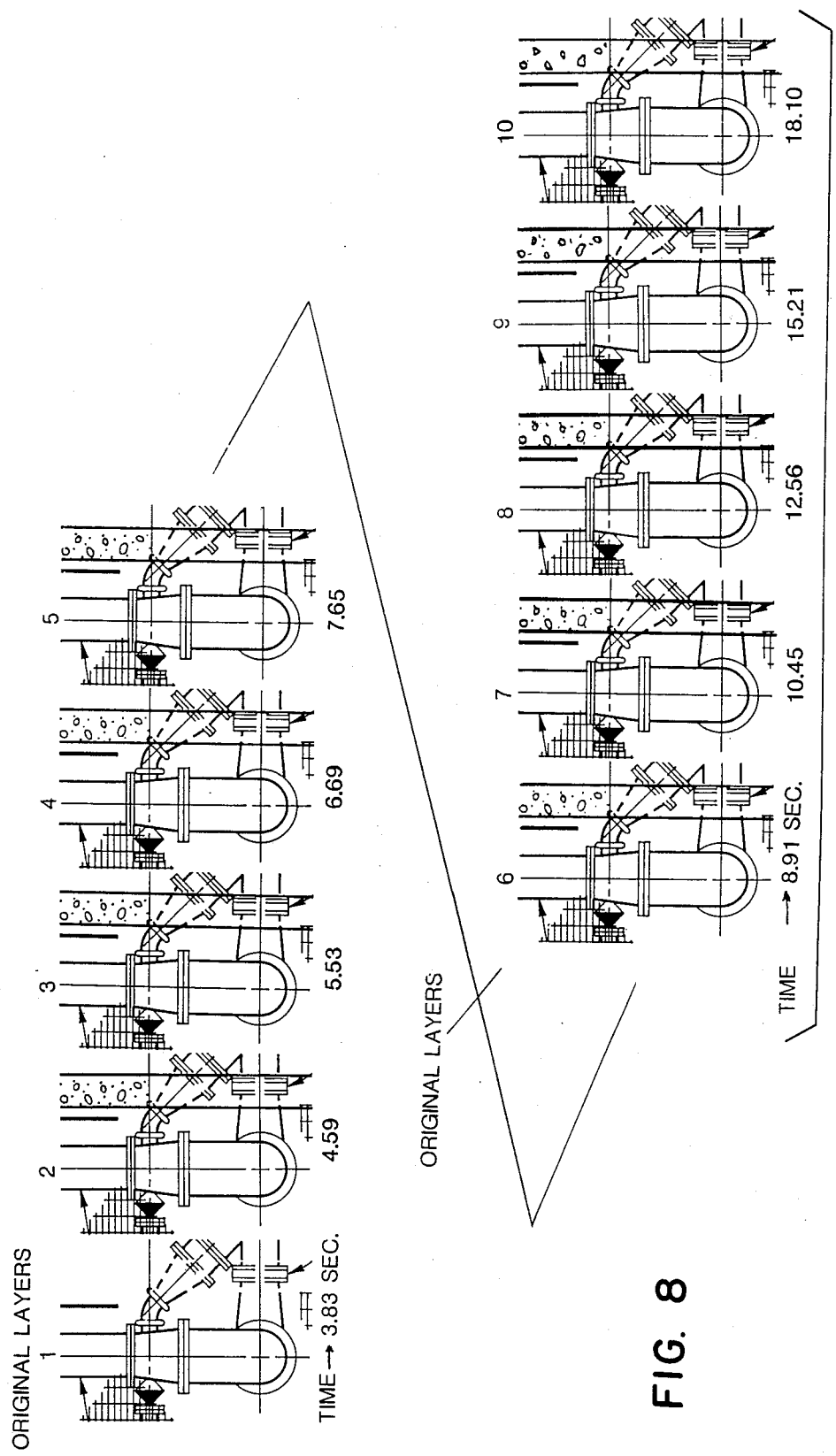
FIGS. 8, 9 and 10 illustrate example prints obtained when photosensitive media is exposed through various numbers of originals under conditions specified hereinafter.
Figure 9:
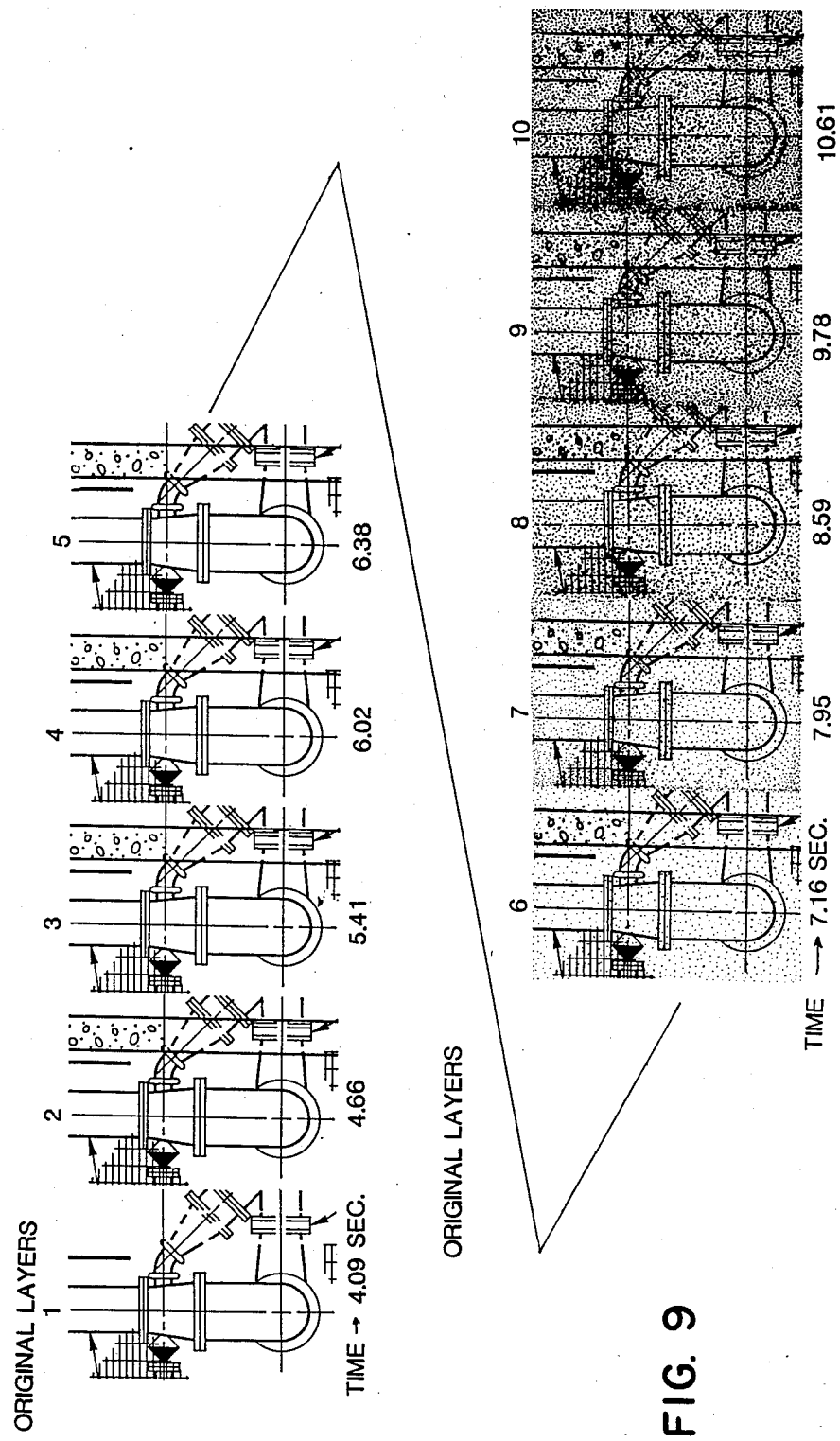
Figure 10:
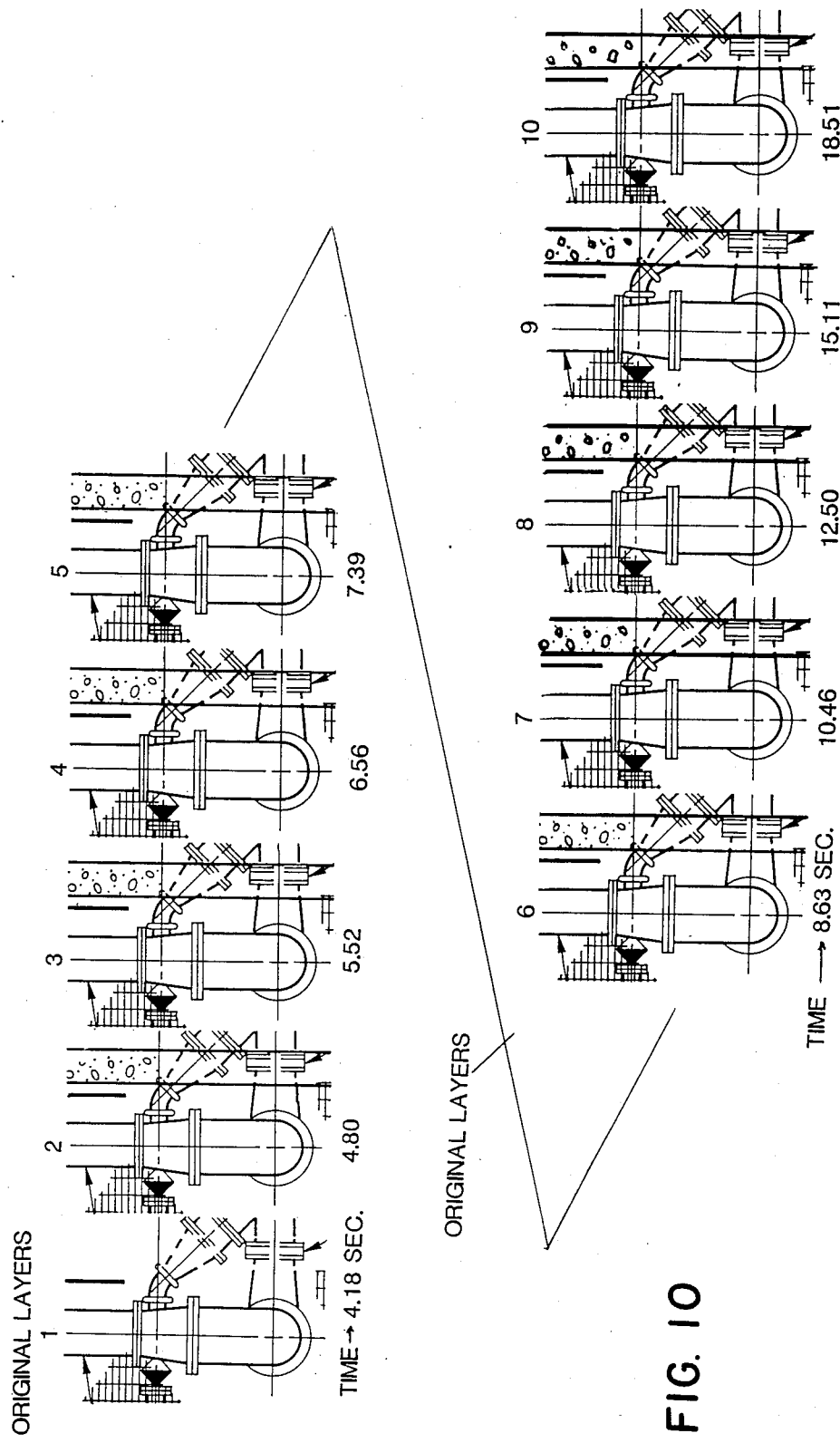

FIGS. 8, 9 and 10 illustrate results obtained from operating the print-making apparatus of the present invention using various numbers of original sheets and with apparatus settings as set forth below.

Each of these figures depict prints obtained with particular respective apparatus settings which were not changed as the number of originals was increased from one to ten. The number above each print sample is the number of originals used. Also, the resulting exposure times for each of the ten samples of each illustration are set forth beneath the samples. In each sample, the same slope adjustment circuit setting was used. Specifically, 4.5 megohms of resistance was positioned between a negative twelve volt Direct Current voltage supply and the integrating capacitors 99, 110. Also, each of the prints were produced using Bruning Speed 5 blue line number 29-2050 Diazo paper, K+E High Transmission Drafting Film 0.004 inches thick No. 19-1354 originals, and a Roll Vac MP4500C, 4KW metal halide lamp, with a peak output of 417 nanometers. Such a lamp is available from Roll Vac Corporation of Corvallis, Ore., although other lamps are of course suitable.

The FIG. 8 example used the light sensing photodiode 70 which was positioned over an aperature 73 in the diazo material. Therefore, the sensor detected light passing through the original sheets, but not the photosensitive media. Also, in this example, the range control circuit 104 was set to provide an additional 150 microfarads of capacitance 110 in the integrator circuit (165 microfarads total). The variable reference was set at 32, corresponding to 3.2 kilohms of resistance in circuit 122. This provided a reference voltage of 1.94 volts. The exposure slope control circuit was set at its maximum resistance of 1.09 megohms resistance. This in effect removed the slope control from having any significant impact on the integrator circuit.

As is apparent from FIG. 8, the resulting exposure was highly satisfactory for all print samples when from one to ten originals were used. Therefore, with these settings and for this photosensitive media and originals, the actual exposure by the apparatus correctly tracked the proper exposure curve for high quality prints over a wide range of originals through which the prints were made.

The FIG. 9 example depicts prints from a test in which the light sensing photodiode 70 was used to detect light passing through the originals and through the sensitized media. In this example, the range control circuit was set at its zero position such that only the 15 microfarads capacitor 99 was coupled to the integrator circuit. Also, the variable reference was set at 43, corresponding to 4.3 kilohms resistance, to provide a reference voltage of 2.63 volts.

With the exposure slope control again set at its maximum resistance, so as to effectively remove its impact from the performance of the integrator circuit, print quality became progressively and noticeably much worse as the number of originals exceeded five. This worsening of print quality resulted from a progressive underexposure of the sensitized media as the number of originals increased. This degradation of print quality was not due to the setting of the range control circuit or the reference voltage as these were adjusted for optimum overall print quality for one original sheet. Thus, it can be seen that, as original layers are added, and density thereby increases, the background of the print continued to darken, even though the reference voltage and range control remained at constant settings. Consequently, when in this configuration, the actual exposure does not satisfactorially track the desired exposure.

This progressive darkening of the print background varies substantially with different types and brands of photosensitive media, emulsions and originals. Although less pronounced, the under exposure can also occur when sensing through an aperature with some types of photosensitive media and originals. Also, in some cases, such as with some types of sepia diazo coatings on clear film, there may be no progressive darkening affect from adding original layers whether sensing is through an aperature 73 or through the photosensitive media.

To compensate for such exposure variations, as illustrated in FIG. 10, the exposure slope control circuit is used. In the FIG. 10 example, the exposure slope control was adjusted to reduce the shunt resistance across the integrator charging capacitor from the maximum magnitude to 400 kilohms. The range control was again set at its zero position so that the total capacitance of the integrator was 15 microfarads. In addition, the reference was set at position 36, corresponding to 3.6 kilohms and a reference voltage of 2.19 volts.

In this case, the light sensing photodiode detected light passing through the originals and through the sensitized media. The results were consistantly high quality print samples even when more than five originals were used. The difference in print quality between the FIGS. 9 and 10 examples is attributable to the exposure slope control circuitry of the present invention. Thus, the effect of the exposure slope control circuit is to progressively and non-linearly increase the light received during exposure as the number of originals increase.

Figure 11:
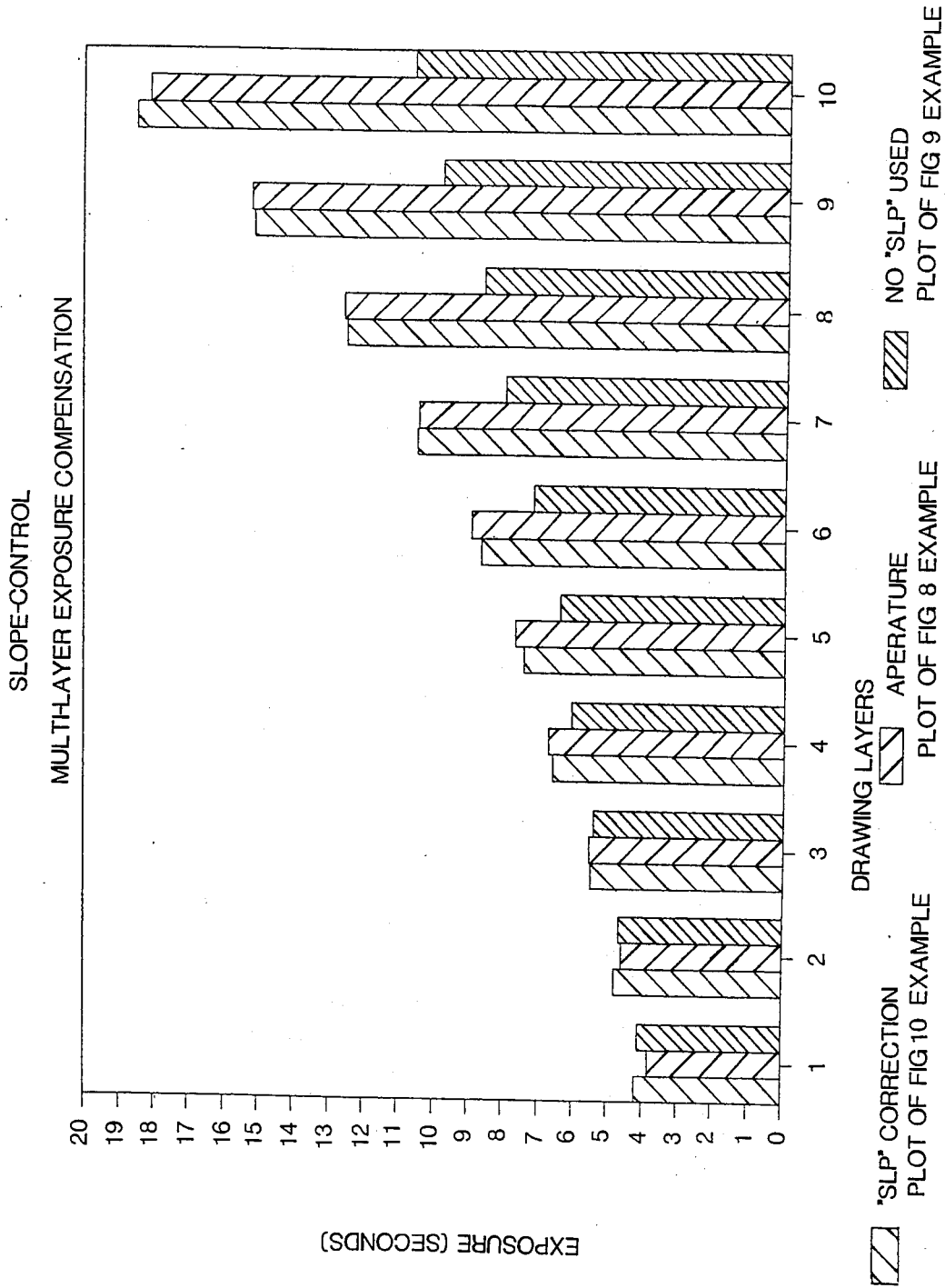
FIG. 11 is a graph illustrating the results obtained in the examples of FIGS. 8, 9 and 10.

The results of the FIGS. 8-10 examples are depicted graphically in FIG. 11. From this graph, it is readily apparent that the exposure in the FIGS. 8 and 10 examples follows progressively increasing curves which closely track each other. Also, the exposure in the FIG. 9 example is progressively relatively less as the number of originals is increased to higher levels. Therefore, the under exposure becomes more pronounced in the FIG. 9 example as the number of originals becomes large. In addition, at relatively low numbers of originals, the desired exposure curve is straighter. Consequently, at these lower levels, all three examples are very close to one another and the prints (see FIGS. 8-10) are of high quality.

Thus, the apparatus of the present invention is useful in a wide range of print-making applications.

Having illustrated and described the principles of our invention with reference to one preferred embodiment, it should be apparent to those persons skilled in the art that such invention may be modified in arrangement and detail without departing from such principals. For example, the light may be transmitted through one or more pieces or samples of material of equivalent density to the original sheets and then sensed. Also, without limiting the generality of the apparatus, the sensitized media includes any such media used in circuit bound production, printing plate applications, silk screening, and proofing in graphic arts applications. In addition, the non-linear exposure adjustment may be accomplished using a microprocessor. In this case, for example, the exposure curves for various types of media, originals and numbers of originals may be digitized and stored. For a given application, the density of the originals is measured and the light required for proper exposure is obtained from the stored data. The light received is digitized and compared with the desired light obtained from the stored data in order to determine the proper exposure. We claim as our invention all such modifications as come within the scope of the following claims.

We claim:

1. An apparatus for exposing photosensitive media to a source of light comprising light sensing means for receiving light from the source during exposure of the photosensitive media, said light sensing means being positioned to receive light from the source which passes through data free areas of one or more original sheets or samples thereof, said apparatus also including light monitoring means for monitoring the light received by the light sensing means and for automatically stopping the exposure of the photosensitive media upon the sensing of a predetermined amount of light, the light monitoring means including means for automatically varying the predetermined amount of light during exposure of the photosensitive media non-linearly with variations in the density of originals through which light passes.

2. An apparatus according to claim 1 in which the means for varying the predetermined amount of light comprises means for automatically increasing the predetermined amount of light non-linearly with increasing numbers of originals through which light passes to the light sensing means.

3. An apparatus according to claim 1 in which the means for varying the predetermined amount of light includes adjustment means for adjusting the rate at which the predetermined amount of light is varied non-linearly.

4. An apparatus according to claim 1 in which the light monitoring means comprises integrator circuit means, the integrator circuit means being responsive to the amount of light sensed over time by the light sensing means for producing an output signal indicative that the predetermined amount of light has been received, the integrator circuit means including capacitor means, the light sensing means comprising means for charging the capacitor means in response to the amount of light received by the light sensing means, the integrator circuit means comprising means for producing the output signal when the capacitor means is charged to a predetermined voltage, the integrator circuit means also including slope control means for partially discharging the capacitor means to reduce the rate of charging of the capacitor means to the predetermined voltage.

5. An apparatus according to claim 4 including slope adjustment means for delivering charge to the capacitor means in addition to the charge from the light sensing means.

6. An apparatus according to claim 4 in which the slope control means includes resistor means in parallel with the capacitor means.

7. An apparatus according to claim 6 in which the slope control means includes means for varying the resistance of the resistor means.

8. An apparatus according to claim 7 in which the capacitor means comprises range control variable capacitor means.

9. An apparatus according to claim 4 in which the capacitor means comprises tantalum capacitor means.

10. A method of exposing a sheet of photosensitive media to a source of light comprising:
   exposing a sandwich of one or more original sheets and a sheet of photosensitive media to a source of light;
   sensing the light passing through data free areas of the original sheets during exposure of the photosensitive media;
   monitoring the light received by the sensing means;
   stopping the exposure upon sensing a predetermined amount of light; and
   automatically increasing the predetermined amount of light non-linearly with increasing numbers of original sheets.

11. A method according to claim 10 in which the step of sensing light comprises sensing the light passing through the original sheets and through the photosensitive media overlying the original sheets.

12. A method according to claim 10 in which the step of sensing light comprises sensing the light passing only through the originals and not through the photosensitive media overlying the original sheets.

13. An apparatus for exposing photosensitive media to a source of light comprising light sensing means for receiving light from the source during exposure of the photosensitive media, said light sensing means being positioned to receive light from the source which passes through one or more original sheets or samples thereof and for producing a light sensor output corresponding to the received light, said apparatus also including light monitoring means for monitoring the light sensor output and exposure termination means for automatically stopping the exposure of the photosensitive media upon the sensing of a predetermined amount of light by the light sensing means, the light monitoring means including means for modifying the sensor output nonlinearly with variation in the density of originals through which light passes.

14. An apparatus for exposing photosensitive media to a source of light comprising:
   light sensing means for receiving light from the source during exposure of the photosensitive media, said light sensing means being positioned to receive light from the source which passes through one or more original sheets or samples thereof during exposure of the data free areas of photo sensitive media;
   light monitoring means for monitoring the light received by the light sensing means and for automatically stopping the exposure of the photosensitive media upon the sensing of a predetermined amount of light;
   the light monitoring means comprising integrator circuit means, the integrator circuit means being responsive to the amount of light sensed over time by the light sensing means for producing an output signal indicative that the predetermined amount of light has been received, the integrator circuit means including capacitor means, the light sensing means comprising means for charging the capacitor means in response to the amount of light received by the light sensing means, the integrator circuit means comprising means for producing the output signal when the capacitor means is charged to a predetermined voltage;
   slope control means for partially discharging the capacitor means to reduce the rate of charging of the capacitor means to the predetermined voltage, the slope control means inclduing means for varying the rate of partial discharge of the capacitor means;
   range control means for varying the capacitance of the capacitor means; and
   reference level means for establishing and varying the predetermined voltage at which the integrator circuit means produces the output signal.

15. An apparatus according to claim 14 including slope adjustment means for delivering charge to the capacitor means in addition to the charge from the light sensing means.

16. An apparatus according to claim 15 in which the slope control means includes resistor means in parallel with the capacitor means.

17. An apparatus according to claim 16 in which the slope control means includes means for varying the resistance of the resistor means.

* * * * *